(12) United States Patent
Chu et al.

(10) Patent No.: US 7,183,158 B2
(45) Date of Patent: Feb. 27, 2007

(54) METHOD OF FABRICATING A NON-VOLATILE MEMORY

(75) Inventors: Chien-Lung Chu, Hsinchu (TW); Jen-Chi Chuang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/148,851

(22) Filed: Jun. 8, 2005

(65) Prior Publication Data

US 2006/0063329 A1 Mar. 23, 2006

(30) Foreign Application Priority Data

Sep. 23, 2004 (TW) .............................. 93128814 A

(51) Int. Cl.
*H01L 21/336* (2006.01)
*H01L 21/4763* (2006.01)
*H01L 21/3205* (2006.01)

(52) U.S. Cl. ................. 438/257; 438/258; 438/259; 438/260; 438/261; 438/262; 438/263; 438/264; 438/265; 438/266; 438/267; 438/954; 438/591; 438/592; 438/593; 438/594; 257/E21.613; 257/E21.665; 257/E21.633

(58) Field of Classification Search ................ 438/257, 438/258–267, 954, 591–594
See application file for complete search history.

(56) References Cited

U.S. PATENT DOCUMENTS

| 6,436,800 | B1 * | 8/2002 | Kuo et al. ................. 438/558 |
| 2003/0203594 | A1 * | 10/2003 | Shimizu et al. ............. 438/424 |
| 2004/0212019 | A1 * | 10/2004 | Shinohara et al. .......... 257/368 |

* cited by examiner

*Primary Examiner*—Michael Lebentritt
*Assistant Examiner*—Mohsen Ahmadi
(74) *Attorney, Agent, or Firm*—J.C. Patents

(57) ABSTRACT

A method of fabricating a nonvolatile memory is provided. The method includes forming a bottom dielectric layer, a charge trapping layer, a top dielectric layer and a conductive layer on the substrate sequentially. Portions of conductive layer, top dielectric layer, charge trapping layer and bottom dielectric layer are removed to form several trenches. An insulation layer is formed in the trenches to form a plurality of isolation structures. A plurality of word lines are formed on the conductive layer and the isolation structures. By using the word lines as a mask, portions of bottom dielectric layer, charge trapping layer, top dielectric layer, conductive layer and isolation structures are removed to form a plurality of devices. The bottom oxide layer has different thickness on the substrate so that these devices can be provided with different performance. These devices serve as memory cells with different character or devices in periphery region.

16 Claims, 7 Drawing Sheets

METHOD OF FABRICATING A NON-VOLATILE MEMORY

CROSS-REFERENCE TO RELATED APPLICATION

This application claims the priority benefit of Taiwan application serial no. 93128814, filed on Sep. 23, 2004. All disclosure of the Taiwan application is incorporated herein by reference.

BACKGROUND OF THE INVENTION

1. Field of Invention

The present invention relates to a method for fabricating semiconductor memory device. More particularly, the present invention relates to a method for fabricating a non-volatile memory device.

2. Description of Related Art

In several types of non-volatile memory device, the EEPROM device, having the advantages of multiple times of operations for write, read and erase, and stored data being not lost after power off, has been a necessary memory device widely used in personal computer and other electronic equipment. The typical EEPROM device uses the doped polysilicon as the floating gate and control gate. The control gate is directly disposed above the floating gate, and a dielectric layer is disposed between the floating gate and the control gate. The floating gate is separated from the substrate by a tunneling oxide. A positive voltage or a negative voltage is applied on the control gate to control the electrons to be injected or discharged from the floating gate, so as to achieve the memory function. However, when the tunnel oxide layer under the polysilicon floating gate layer has defects, it easily causes the current leakage of the device, and affects the device reliability.

Therefore, in order to solve the issue of current leakage in EEPROM device, the conventional method uses the charge trapping layer to replace the conventional polysilicon floating gate in the conventional memory device. Material for the charge trapping layer can be silicon nitride. For this charge trapping layer by silicon nitride, an oxide layer is formed on each up and lower side, so as to form a stacked structure of silicon-oxide/silicon-nitride/silicon-oxide (ONO). The ROM device with the stacked structure for the gate electrode can be referred to silicon-oxide-nitride-oxide-silicon (SONOS) memory device.

In the other hand, during the processes for fabricating the memory device, the fabrication processes for the memory cell region and the periphery circuit region are usually integrated together. However, due to difference of requirements on the fabrication processes for the memory cell region and the periphery circuit region, when the memory cell region (or periphery circuit region) is in fabrication, a mask is needed to mask the periphery circuit region (or memory cell region). This causes the complexity for fabrication process and increase of fabrication cost.

Also and, in the conventional method for fabrication the memory device, the memory cells have a single characteristic. How to simultaneously fabricate the memory cells with multiple characteristics under the processes is the main concerning in development.

SUMMARY OF THE INVENTION

In an aspect invention, the invention provides a fabrication method for a nonvolatile memory device. Under the same fabrication process, the memory cell can be formed on the memory cell region and the periphery device can be formed on the periphery circuit region at the same time.

In another aspect of the invention, the invention provides a fabrication method for a nonvolatile memory device. Under the same fabrication process, the memory cells with at least two characteristics can be fabricated.

Te invention provides a fabrication method for a nonvolatile memory device, including providing a substrate, which at least has a memory cell region and a periphery circuit region. Then, a first bottom dielectric layer is formed over the memory cell region and a second bottom dielectric layer is formed over the periphery circuit region, in which a thickness of the second bottom layer is larger than a thickness of the first bottom dielectric layer. A charge trapping layer is formed on the first bottom dielectric layer, and a first dielectric layer is formed on the second bottom dielectric layer. After a top dielectric layer is formed over the charge trapping layer and the first dielectric layer, a conductive layer is formed over the top dielectric layer, and a patterned mask layer is formed on the conductive layer. After then, using the patterned mask layer as the mask, portions of the conductive layer, the top dielectric layer, the charge trapping layer, the first dielectric layer, the first bottom dielectric layer, the second bottom dielectric layer and the substrate are removed for forming multiple trenches. After filling insulation layer in the trenches, the patterned mask layer and a portion of the insulation layer are removed to expose the conductive layer for forming isolation structures. After forming multiple word lines over the conductive layer and the isolation structures, the word lines are used as the mask for removing portions of the conductive layer, the top dielectric layer, the charge trapping layer, the first dielectric layer, the first bottom dielectric layer, the second bottom dielectric layer, and the isolation structure, so as to form multiple memory cell structures in the memory cell region and multiple structures of periphery circuit device in the periphery circuit region. Then, the source/drain regions are formed in the substrate at each side of the memory cell structures and the structures of periphery circuit device.

In the foregoing fabrication process of the nonvolatile memory device, the thickness of the first bottom dielectric layer over the substrate in the memory cell region is less than the thickness of the second bottom dielectric layer in the periphery circuit region. Therefore, the first bottom dielectric layer with smaller thickness in the memory cell region is serving as the tunnel dielectric layer. After the charge trapping layer, the top dielectric layer and the conductive layer are subsequently formed to form the SONOS memory structure. The second bottom dielectric layer in the periphery circuit region has larger thickness, and is used together with the subsequent first dielectric layer, the top dielectric layer to serve as the gate dielectric layer. When the conductive layer is additionally formed, a MOS structure is then formed. By forming the bottom dielectric layer with different thickness, the memory cell region and the periphery circuit region can be fabricated at the same time, without needing the mask layer to cover the memory cell region or the periphery circuit region in fabrication processes. The fabrication process can be simplified and the cost can be reduced.

The invention also provides a fabrication method for a nonvolatile memory device, including providing a substrate, which has multiple memory cell regions. A bottom dielectric layer is formed over the substrate, and the thickness of the bottom dielectric layer with respect to the different memory cell region is different. A charge trapping layer is formed over the bottom dielectric layer. A top dielectric layer is formed over the charge trapping layer. A conductive layer is formed over the top dielectric layer. Portions of the conductive layer, the top dielectric layer, the charge trapping layer, the bottom dielectric layer, and the substrate are removed to form multiple trenches. An insulation layer is filled into the trenches to form multiple isolation structures. Then, multiple word lines are formed over the conductive layer and the isolation structures. The word lines are used as the mask to remove portions of the conductive layer, the top dielectric layer, the charge trapping layer, the bottom dielectric layer, and the isolation structures are removed to form multiple memory structures within each of the memory cell regions. A source/drain region is formed in the substrate at each side of the memory cell structures.

For the nonvolatile memory in the invention, since the bottom dielectric layer has at least two different quantities of thickness in fabrication, the memory cells being consequently formed can have different properties with respect to the different thickness of the bottom dielectric layer. The fabrication method of the invention for the nonvolatile memory device can have the advantages of reducing the cell size and improving reliability of device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 1A–1G are top views, schematically illustrating the fabrication processes for a nonvolatile memory device, according to a preferred embodiment of the invention. FIGS. 2A–2G are cross-sectional views, schematically illustrating the fabrication processes for a nonvolatile memory device, according to a preferred embodiment of the invention.

Figure 1A:
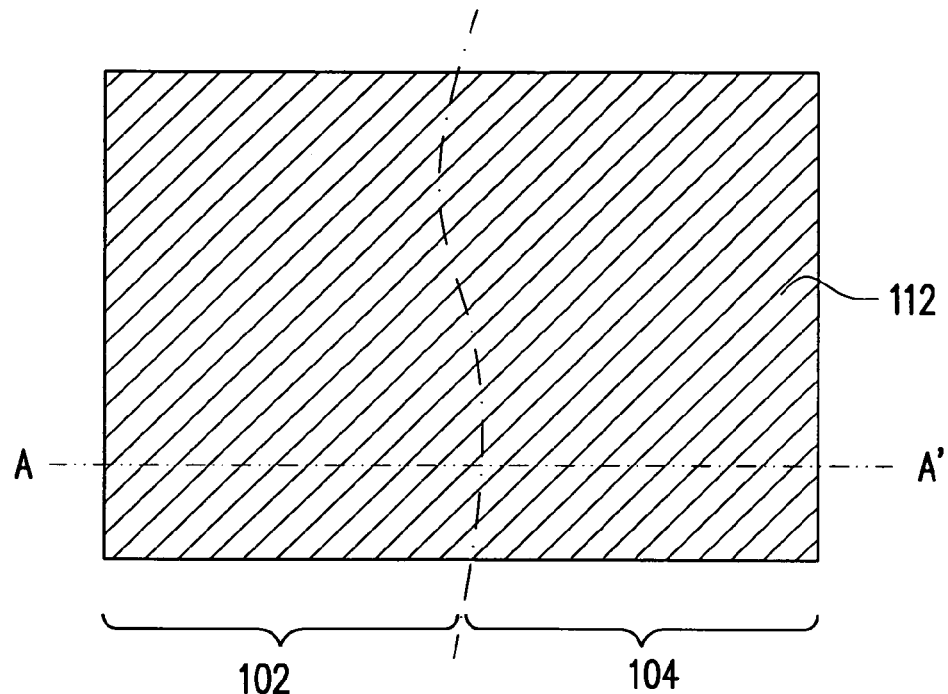
FIGS. 1A–1G are top views, schematically illustrating the fabrication processes for a nonvolatile memory device, according to a preferred embodiment of the invention.
Figure 2A:
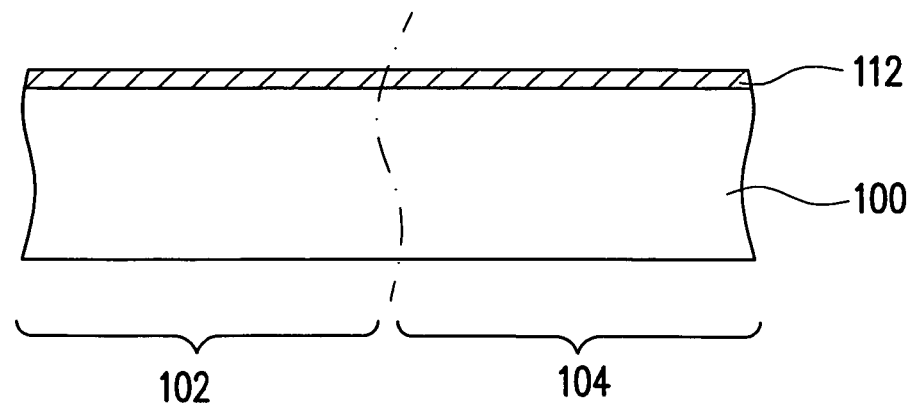
FIGS. 2A–2G are cross-sectional views, schematically illustrating the fabrication processes for a nonvolatile memory device, according to a preferred embodiment of the invention.

First referring to FIG. 1A and FIG. 2A, a substrate 100, is provided. The substrate 100 is for example a silicon substrate and the substrate 100 can be divided into at least a first device region 102 and second device region 104. Then, a first bottom dielectric layer 112 can be formed over the substrate 100. The first bottom dielectric layer 112 covers over the first device region 102 and the second device region 104 of the substrate 100 by a material such as silicon oxide. The formation includes for example the thermal oxidation.

Figure 1B:
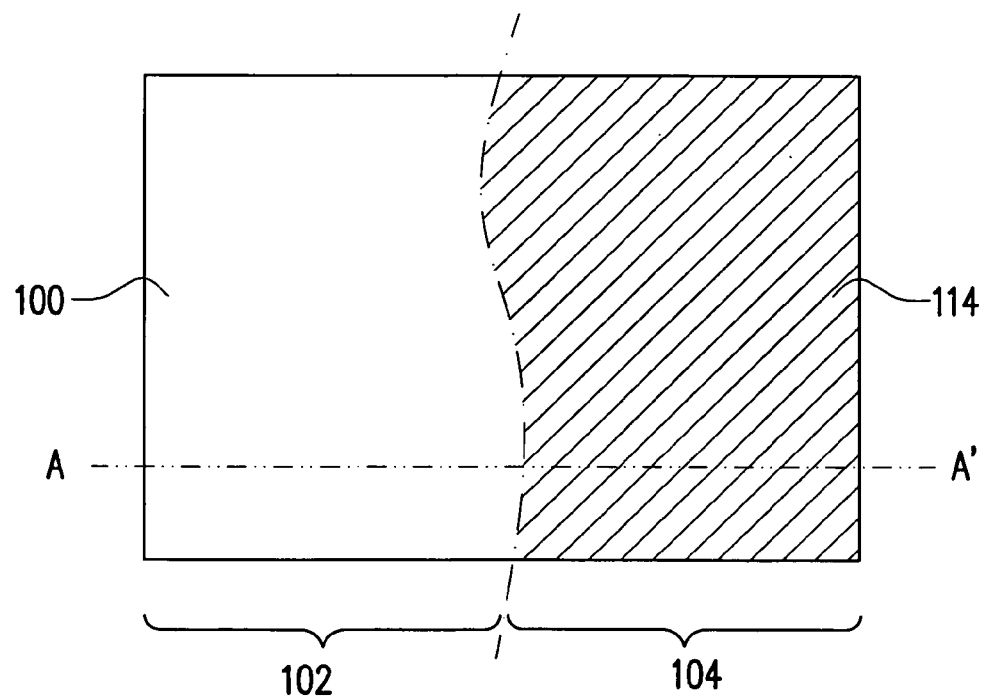
Figure 2B:
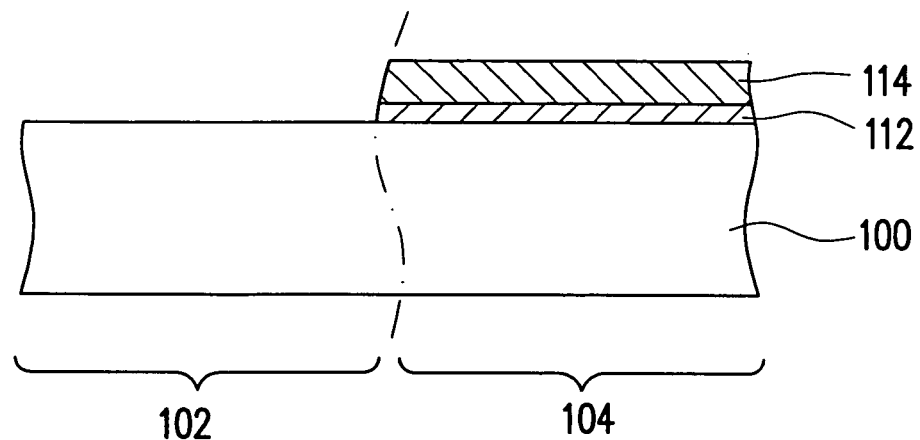

Then, in FIG. 1B and FIG. 2B, a patterned photoresist layer 114 on the first bottom dielectric layer 112. The formation includes using the photolithographic method. Then, the patterned photoresist layer 114 is used as the mask, the portion of the first bottom dielectric layer 112 over the first device region 102 is removed, and the portion of the first bottom dielectric layer 112 over the device region 104 of the substrate 100 remains.

Figure 1C:
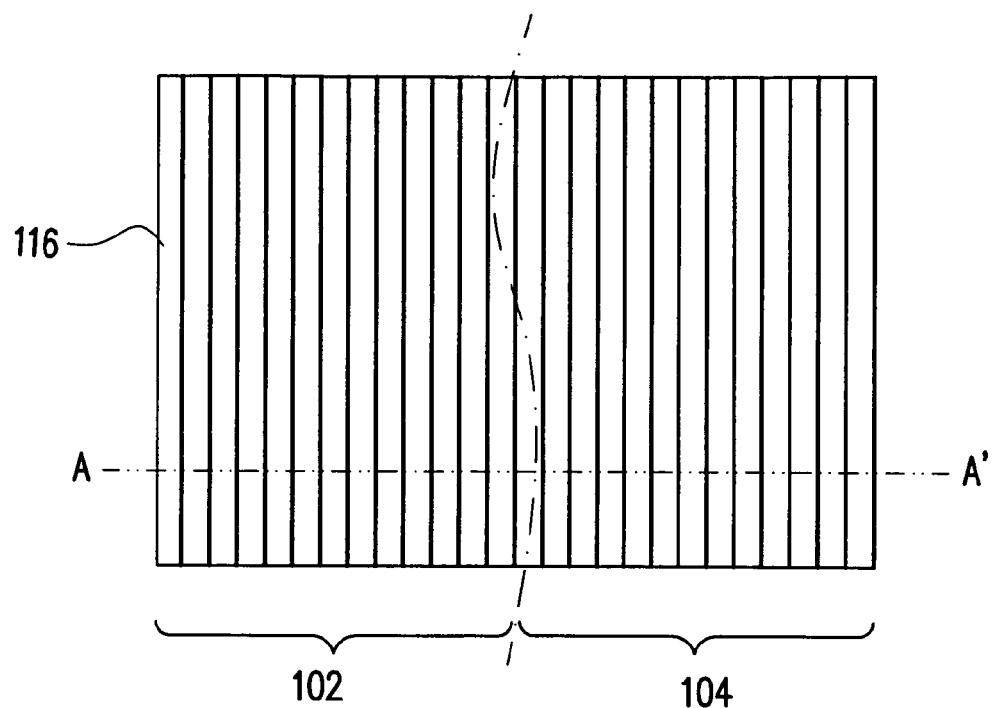
Figure 2C:
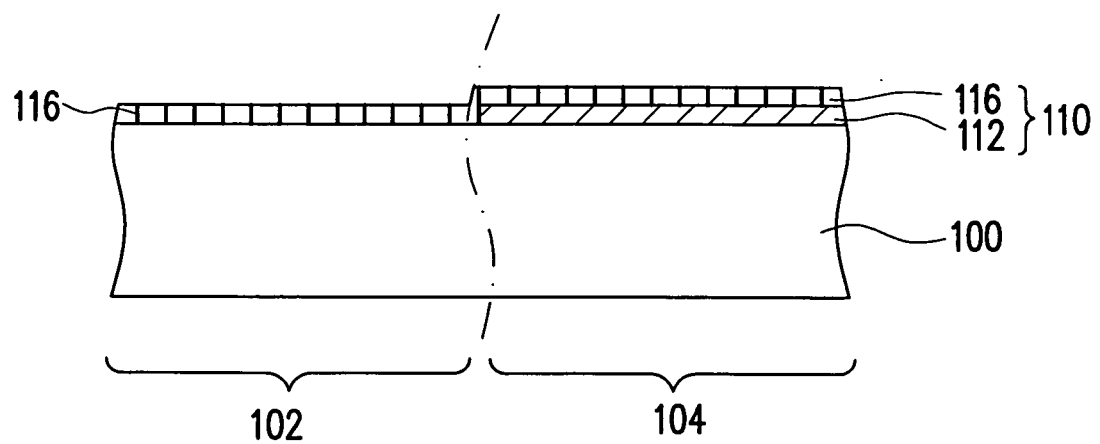

Then, in FIG. 1C and FIG. 2C, after removing the patterned photoresist layer 114, a second bottom dielectric layer 116 is formed over the first device region 102 and second device region 104 of the substrate 100. The second bottom dielectric layer 116 can be, for example, silicon oxide, and the formation includes for example the thermal oxidation. At the second device region 104, the second bottom dielectric layer 116 and the first dielectric layer 112 form the bottom dielectric layer 110. Therefore, the bottom dielectric layer 116 over the first device region 102 and the bottom dielectric layer 110 over the second device region 104 have different thickness.

In other words, in the embodiment, the bottom dielectric layer 110 over the second device region 104 has a thickness greater than a thickness of the bottom dielectric layer 116 over the first device region 102.

Figure 1D:
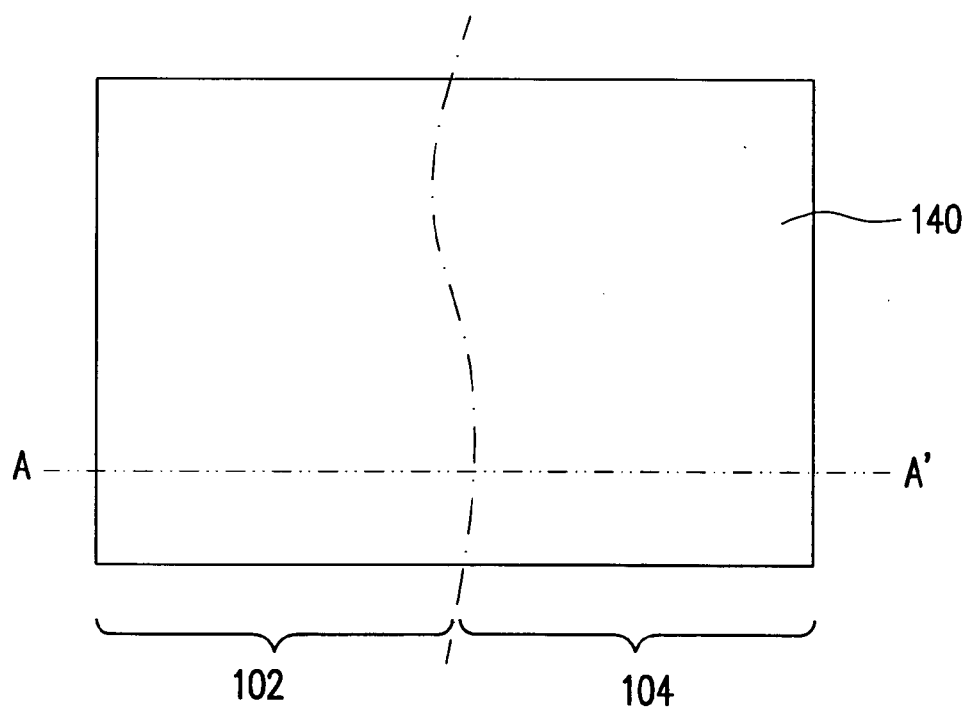
Figure 2D:
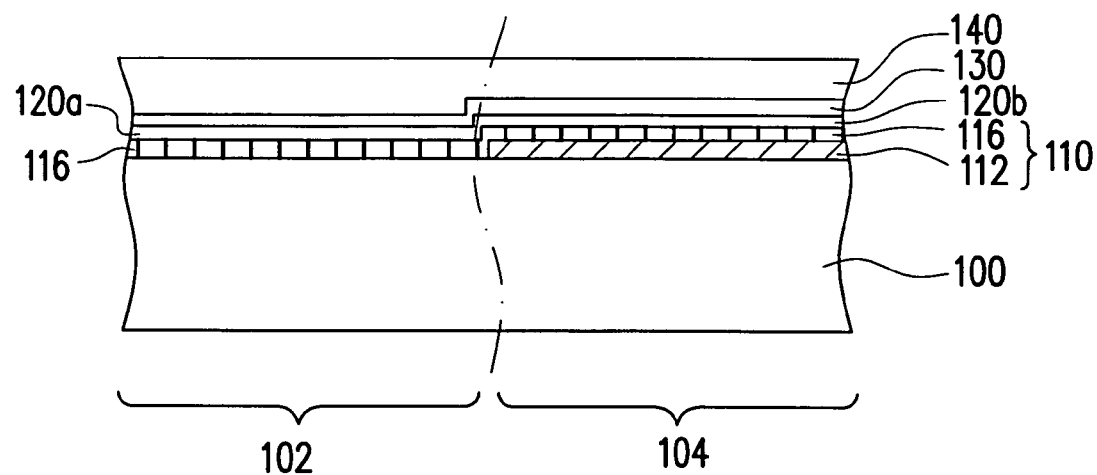

In FIG. 1D and 2D, a charge trapping layer is deposited over the substrate 100, to form a charge trapping layer 120a on the bottom dielectric layer 116 over the first device region 102 and a charge trapping layer 120b on the bottom dielectric layer 110 over the second device region 102. The charge trapping layer 120a and the charge trapping layer 120b include, for example, silicon nitride. A top dielectric layer 130 is formed over the charge trapping layer 120a and the charge trapping layer 120b. The top dielectric layer includes for example silicon oxide. Then, a conductive layer 140 is formed over the top dielectric layer 130. This conductive layer 140 includes, for example, doped polysilicon. The process for forming above bottom dielectric layer 110, charge trapping layer 120a, charge trapping layer 120b, top dielectric layer 130 and conductive layer 140 can be, for example, comical vapor deposition (CVD).

Figure 1E:
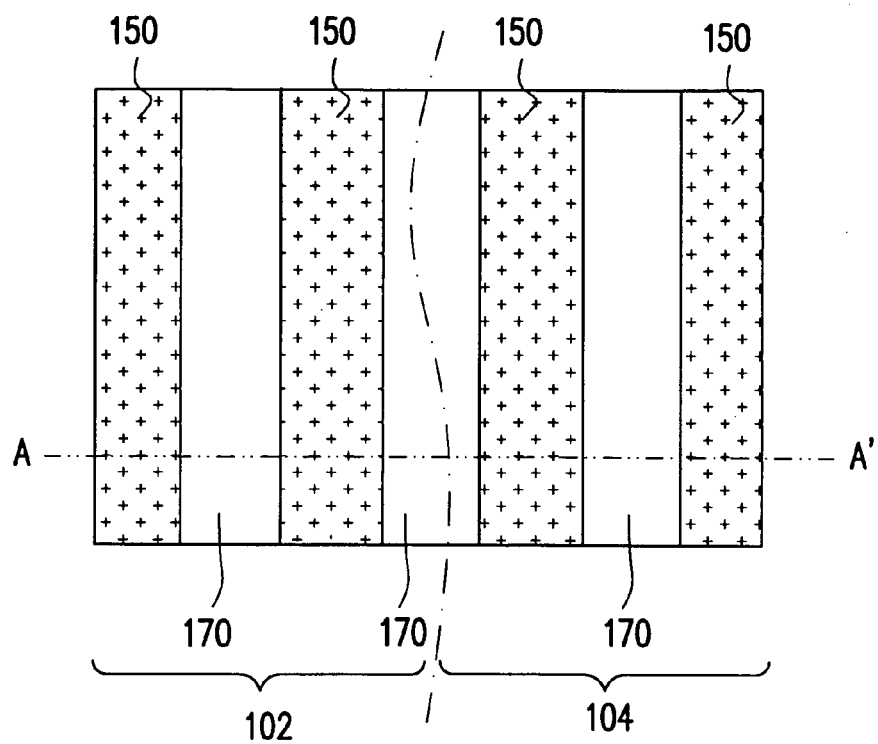
Figure 2E:
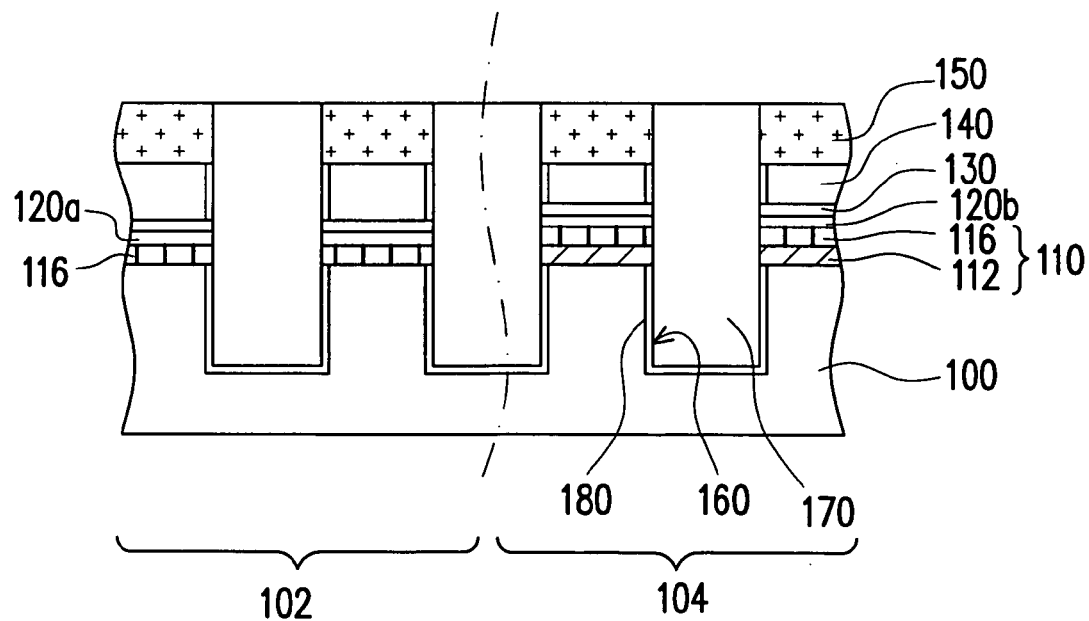

Then, in FIG. 1E and FIG. 2E, a patterned mask layer 150 is formed on the conductive layer 140. The patterned mask layer 150 can be, for example, silicon nitride. Then, the patterned mask layer 150 is used as the mask, and for example, an etching back process, such as, dry etching is performed to removes portions of the conductive layer 140, the top dielectric layer 130, the charge trapping layer 120a, the charge trapping layer 120b, the bottom dielectric layer 110 and the substrate 100, so as to form several trenches 160. Then, an insulation layer 170 fills into the trenches 160 by, for example, silicon oxide. In addition, before filling the insulation layer 170 into the trenches 160, a liner layer 180 can, for example, be formed on surface of the trenches. The liner layer 180 can be formed by, for example, thermal oxidation.

Figure 1F:
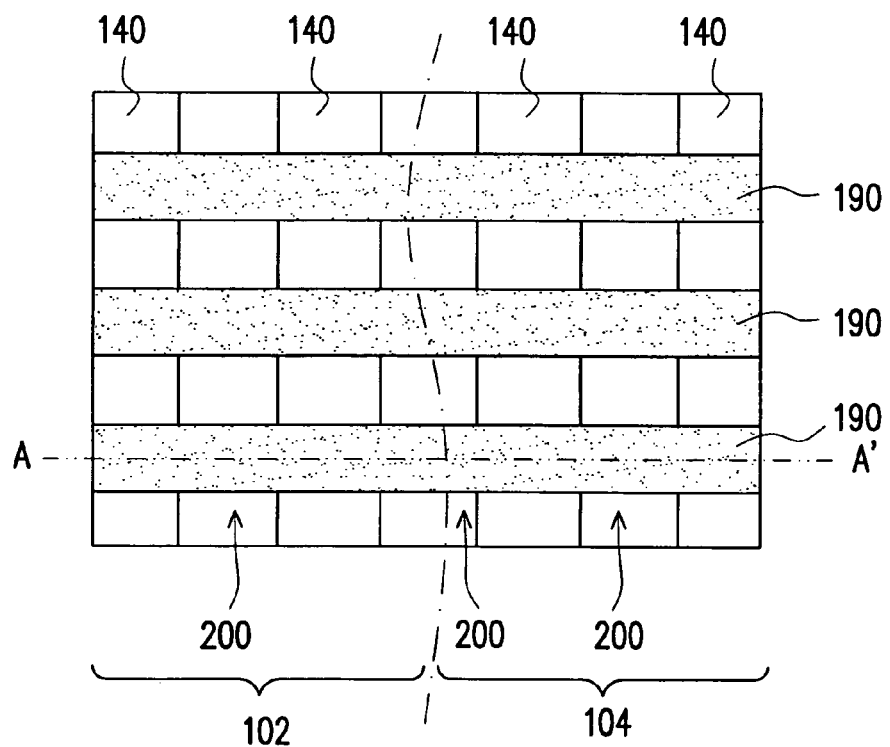
Figure 2F:
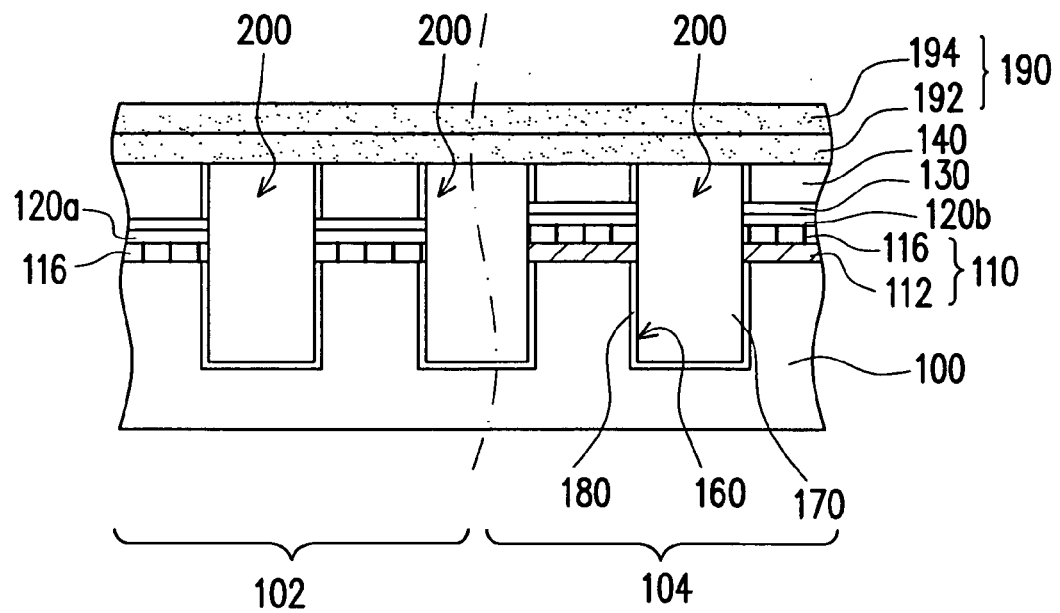

Then, in FIG. 1F and FIG. 2F, the patterned mask layer 150 and a portion of the insulation layer 170 are removed until a surface of the conductive layer 140 is exposed, so as to form several isolation structures 200. The process to remove the patterned mask layer 150 and the portion of the insulation layer 170 to expose the conductive layer 140 includes, for example, etching back process or chemical mechanical polishing. Then, after removing the foregoing mask layer 150, several word lines 190 are formed over the insulation layer 170 and the conductive layer 140, and the word lines 190 extend along a direction, which is perpendicular to the extending direction of the isolation structures 200. In addition, the word line 190 includes, for example, a polysilicon layer 192 and silicide layer 194.

Figure 1G:
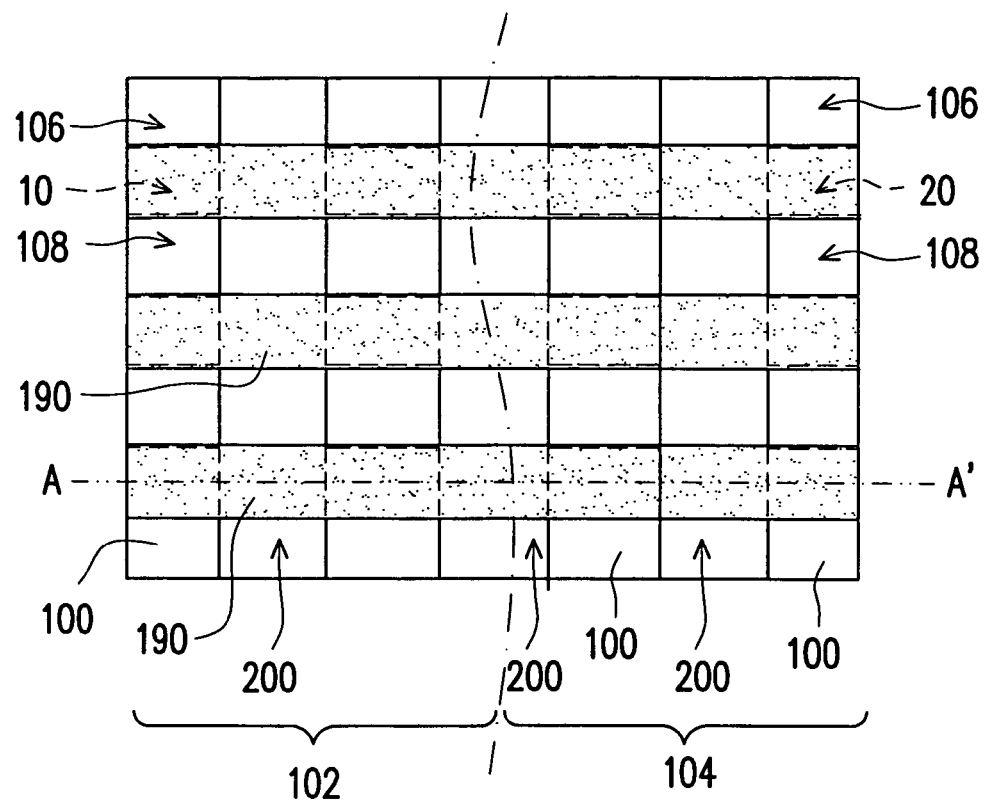
Figure 2G:
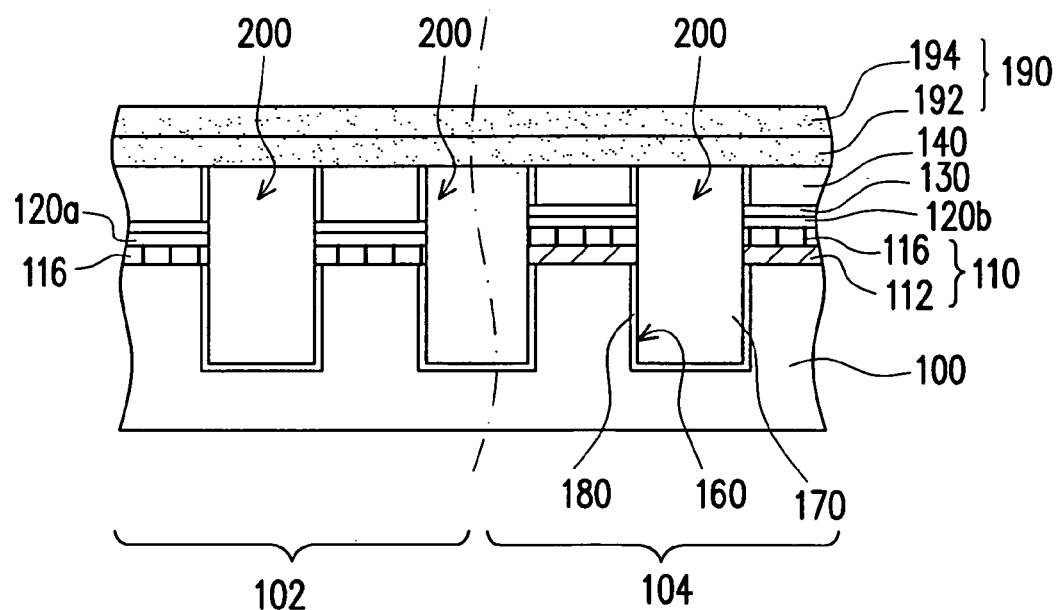

Then, in FIG. 1G and 2G, taking the word lines 190 as the mask to remove portions of the conductive layer 140, the top dielectric layer 130, the charge trapping layer 120, the bottom dielectric layer 110 and the isolation structures 200. As a result, several first device structures 10 are formed in the first device region 102 and several second device structures 20 are formed in the second device region 104 in the second device region 104. Source regions 106 and drain regions 108 are respectively formed in the substrate 100 at each side of the first device structures 10 and the second device structures 20, so as to form the nonvolatile memory device of the invention.

In the embodiment of the invention, the first device region 102 is, for example, a memory cell region, and the second device region 104 is, for example, the periphery circuit region. Each of memory cells over the first device region 102 is formed including the bottom dielectric layer 116, the charge trapping layer 120a, the top dielectric layer 130, the conductive layer 140, the source region 106 and the drain-region 108. The periphery circuit device over the second device region 104 is formed including gate dielectric layer (bottom dielectric layer 116, charge trapping layer 120b, top dielectric layer 130), conductive layer 140, source region 106 and drain region 108. Here, the charge trapping layer 120b in the periphery circuit region serves as the dielectric layer.

During the processes for fabricating the memory device, since the bottom dielectric layer 116 over the first device region 102 of the substrate 100 has a thickness, which is smaller than the thickness of the bottom dielectric layer 110 over the second device region 104, the devices in the first device regions 102 and in the second device region 104 have different properties. The bottom dielectric layer 116 over the first device region 106 has been thinner, so as to serve as the tunnel dielectric layer. Then, the charge trapping layer 120a, the top dielectric layer 130, and the conductive layer 140 are subsequently formed to form the SONOS memory structure, that is, the memory cell structure of the device structure 10. The bottom dielectric layer 110 over the second device region 104 has been thicker, and serves together with the subsequent dielectric layer (charge trapping layer 120b), the top dielectric layer 150 as a gate dielectric layer. In addition to the conductive layer 140, a MOS structure with the second device structure 20 is formed. Due to the differences of thickness for the bottom dielectric layer, the memory cell region and the periphery circuit region can be fabricated at the same time. It is no need to use the mask layer to cover the memory cell region or the periphery circuit region during the fabrication processes, so as to simplify the fabrication process and reduce the cost.

In another embodiment of the invention, the first device region 102 is, for example, a first memory cell region, and the second device region 104 is, for example, a second memory cell region. Each of the memory cells over the first device region 102 is formed with the bottom dielectric layer 116, the charge trapping layer 120a, the top dielectric layer 130, the conductive layer 140, the source region 106 and the drain region 108, so as to form the SONOS memory cell structure, that is, the first memory cell structure by the device structure 10. Each memory cell over the second device region 104 is formed from the bottom dielectric layer 110, the dielectric layer 120b (the dielectric layer 120b of the embodiment serves as the charge trapping layer), top dielectric layer 130, the conductive layer 140, the source region 106 and the drain region 108, so as to form the SONOS memory cell structure, that is, the second memory cell structure by the second device structure 20.

During the processes for fabricating the memory device in the invention, the bottom dielectric layer 116 over the first device region 102 of the substrate 100 has a thickness, which is smaller than the thickness of the bottom dielectric layer 110 over the second device region 104. When the voltage applied on the memory cell structures in the first device regions 102 and in the second device region 104, the memory cells in the two memory cell regions have different performance in characteristics. This causes the different characteristics of better electric erasing capability or better electric preserving capability for the memory cell structures in the first device region 102 and the second device region 104. Also and, by forming the different thickness for the bottom dielectric layer, different characteristics of the memory cells can be fabricated without needing a mask to cover one of the memory cell regions during fabrication processes. The fabrication process can be simplified and the cost can be reduced.

In the foregoing embodiment, the substrate is divided into two device regions, and these two device regions have the bottom dielectric layers with two different thickness, so as to form two device structures, such as memory cell and periphery circuit device, or two memory cells with different performance. However, as known by the ordinary skilled artisans, the invention allows the substrate to be divided several regions, and the bottom dielectric layer at different device regions can be formed with different thickness, so as to fabricate several device structures.

The method for fabricating the nonvolatile memory device in the invention forms the bottom dielectric layer with at least two different quantities of thickness, so that the device structures can be fabricated in accordance with the different thickness for the bottom dielectric layer and then thereby can have different performance. In addition, the method for fabricating the nonvolatile memory device in the invention can achieve to reduce memory cell size, and further improve device reliability.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:
1. A method for fabricating nonvolatile memory device, comprising:
providing a substrate, having at least a memory cell region and a periphery circuit region;
forming a first bottom dielectric layer over the memory cell region, and a second bottom dielectric layer over the periphery circuit region, a thickness of the second bottom dielectric layer is greater than a thickness of the first bottom dielectric layer;
forming a charge trapping layer over the substrate;
forming a top dielectric layer over the charge trapping layer;
forming a conductive layer over the top dielectric layer;
forming a patterned mask layer over the conductive layer;
removing portions of the conductive layer, the top dielectric layer, the charge trapping layer, the first bottom dielectric layer, the second bottom dielectric layer and the substrate using the patterned mask layer as a mask, to form a first gate electrode structure at the memory cell region and a second gate electrode structure at the periphery circuit region and a plurality of trenches in the substrate;
filing an insulation layer into the trench; and
removing the patterned mask layer and a portion of the insulation layer until the conductive layer is exposed, so as to form the device isolation structure; and forming source/drain regions adjacent to the first gate electrode structure and the second gate electrode structure.

2. The method of claim 1, wherein the step of forming the first bottom dielectric layer over the memory cell region, and the second bottom dielectric layer over the periphery circuit region comprises:

forming a third dielectric layer over the substrate;

forming a first patterned photoresist layer over the third dielectric layer;

using the first patterned photoresist layer as a mask to remove a portion of the third dielectric layer at the memory cell region;

removing the first patterned photoresist layer; and forming the first bottom dielectric layer over the substrate, wherein the first dielectric layer and the third dielectric layer on the periphery circuit region form the second dielectric layer.

3. The method of claim 2, wherein formation of the third dielectric layer comprises thermal oxidation.

4. The method of claim 1, wherein a material constituting the first bottom dielectric layer, the second bottom dielectric layer and the top dielectric layer includes silicon oxide.

5. The method of claim 1, wherein a material constituting the charge trapping layer includes silicon nitride.

6. The method of claim 1, wherein a material constituting the conductive layer includes doped polysilicon.

7. The method of claim 1, wherein the method of removing the patterned mask layer and the portion of the insulation layer comprises chemical mechanical polishing.

8. The method of claim 1, before filling the insulation layer into the trench, further comprising forming a liner layer on a surface of the trench.

9. The method of claim 8, wherein the liner layer is formed by thermal oxidation.

10. A method for fabricating nonvolatile memory device, comprising:

providing a substrate, having a plurality of memory cell regions;

forming a bottom dielectric layer over the substrate, having different thickness for different one of the memory cell regions;

forming a charge trapping layer over the bottom dielectric layer;

forming a top dielectric layer over the charge trapping layer;

forming a conductive layer over the top dielectric layer;

removing portions of the conductive layer, the top dielectric layer, the charge trapping layer, the bottom dielectric layer and the substrate to form a plurality of gate electrode structures and a plurality of trenches in the substrate;

filling an insulation layer into the trenches, to form the device isolation structures; and forming source/drain regions adjacent to the gate electrode structures.

11. The method of claim 10, wherein the memory cell region comprises a first memory cell region and a second memory cell region, and the steps for forming the bottom dielectric layer comprises:

forming a first dielectric layer over the substrate;

forming a first patterned photoresist layer over the first dielectric layer, wherein the first patterned photoresist layer exposes the first dielectric layer at the first memory cell region;

using the first patterned photoresist layer as a mask to remove the first dielectric layer at the first memory cell region;

removing the first patterned photoresist layer; and forming a second dielectric layer over the substrate, wherein the second dielectric layer covers the first dielectric layer on the second memory cell region.

12. The method of claim 11, wherein a method of forming the first dielectric layer and the second dielectric layer includes thermal oxidation.

13. The method of claim 10, wherein a material constituting the bottom dielectric layer and the top dielectric layer includes silicon oxide.

14. The method of claim 10, wherein a material constituting the charge trapping layer includes silicon nitride.

15. The method of claim 10, wherein a material constituting the conductive layer includes doped polysilicon.

16. The method of claim 10, further including a step of forming a plurality of device isolation structures between the gate electrode structures.

* * * * *